United States Patent [19]

Lynch

[11] Patent Number: 5,304,834
[45] Date of Patent: Apr. 19, 1994

[54] SELECTIVE EPITAXY OF SILICON IN SILICON DIOXIDE APERTURES WITH SUPPRESSION OF UNWANTED FORMATION OF FACETS

[75] Inventor: William T. Lynch, Summit, N.J.
[73] Assignee: AT&T Bell Laboratories, Murray Hill, N.J.
[21] Appl. No.: 6,094
[22] Filed: Jan. 15, 1993

Related U.S. Application Data

[62] Division of Ser. No. 704,749, May 23, 1991.
[51] Int. Cl.$^5$ ................ H01L 27/01; H01L 27/13; H01L 29/18
[52] U.S. Cl. ................ 257/374; 257/622
[58] Field of Search ................ 257/622, 510, 374

[56] References Cited

U.S. PATENT DOCUMENTS

| | | | |
|---|---|---|---|
| 3,421,055 | 1/1969 | Bean et al. | 437/89 |
| 3,425,879 | 2/1969 | Shaw et al. | 437/89 |
| 4,758,531 | 7/1988 | Beyer et al. | 156/612 |
| 4,786,615 | 11/1988 | Liaw et al. | 437/89 |
| 5,108,947 | 4/1992 | Demeester et al. | 437/89 |

OTHER PUBLICATIONS

Ishitani, A. et al., "Facet Formation in Selective Silicon Epitaxial Growth," *Japanese Journal of Applied Physics*, vol. 24, No. 10, Oct., 1985, pp. 1267-1269.
Endo, N. et al., "Novel Device Isolation Technology with Selective Epitaxial Growth," *IEEE Transactions on Electron Devices*, vol. ED-31, No. 9, Sep. 1984, pp. 1283-1288.
Tanno, K. et al., "Selective Silicon Epitaxy Using Reduced Pressure Technique", *Japanese Journal of Applied Physics*, vol. 21, No. 9, Sep., 1982, pp. L-564-L-566.
Sugawara, K., "Facets Formed by Hydrogen Chloride Vapor Etching on Silicon Surfaces through Windows in SiO$_2$ and Si$_3$N$_4$ Masks," *J. Electrochem. Soc.*, Solid State Science, Jan., 1971, pp. 110-114, vol. 118, No. 1.

*Primary Examiner*—Andrew J. James
*Assistant Examiner*—Stephen D. Meier
*Attorney, Agent, or Firm*—David I. Caplan

[57] ABSTRACT

In the prior art, selective epitaxial growth (SEG) of semiconductors, performed typically in rectangular windows penetrating through a masking layer located on a major surface of semiconductor substrate, suffers from unwanted facet formation at the corners of the windows—whereby the desirable planar area available for transistor fabrication is reduced. Such facet formation is suppressed—i.e., the area occupied by unwanted facets is reduced—by adding a relatively small lobe penetrating through the masking layer at each corner of each window prior to performing the SEG, whereby transistor packing density can be increased.

11 Claims, 2 Drawing Sheets

SELECTIVE EPITAXY OF SILICON IN SILICON DIOXIDE APERTURES WITH SUPPRESSION OF UNWANTED FORMATION OF FACETS

This is a division of application Ser. No. 07/704749 filed May 23, 1991.

TECHNICAL FIELD

This invention relates to semiconductor integrated circuits and more particularly to methods for processing dielectrically isolated devices in such circuits.

BACKGROUND OF THE INVENTION

A commonly used method for processing metal oxide semiconductor (MOS) transistors and bipolar transistors in integrated circuits at a major surface of a semiconductive silicon body (substrate) involves the local oxidation of silicon (LOCOS) process for electrically isolating neighboring transistors. In that process, the major surface of the silicon substrate is masked with a silicon nitride layer having (rectangular) window areas, and the exposed silicon in these window areas is oxidized. However, owing to lateral oxidation of silicon under the silicon nitride mask, the LOCOS process undesirably increases the required distance between neighboring transistors, whereby the transistor packing density is undesirably reduced.

In order to avoid the aforementioned disadvantage of the LOCOS process, selective epitaxial growth (SEG) of silicon has been proposed as an alternative. In SEG, an epitaxial layer of semiconductive silicon is grown on the exposed portions of the major surface of a semiconductive silicon body, these exposed portions being located at the bottom of windows in an insulating layer located on the major surface of the silicon body. At the same time, no silicon accumulates on the insulating layer—hence the use of the word "selective" in SEG. However, in prior art a major problem associated with SEG is the unwanted formation of facets at the corners of the windows, whereby significant portions of the overall resulting surface of the SEG silicon become undesirably non-planar, so that the transistor packing density again is reduced. For example, when fabricating an MOS transistor on a major surface of SEG silicon grown on silicon which is oriented (100), the undesired facets are oriented (311), these facets being undesired because it is desirable that the active region of the gate of the transistor everywhere be confined to areas overlying the portion of the major surface oriented (100).

In U.S. Pat. No. 4,786,615 entitled "Method for Improved Surface Planarity in Selective Epitaxial Silicon," issued to Liaw et al on Nov. 22, 1988, a method for SEG of silicon by chemical vapor deposition (into an assumedly rectangular window) was disclosed, in order to obtain a substantially planar epitaxial silicon surface. In that method, superimposed epitaxial silicon layers were grown in windows penetrating through a masking layer at temperatures above and below a transition point. The masking layer could be a single layer of insulating material, such as silicon dioxide, or it could be a multilayered mask, such as silicon dioxide located on doped polysilicon located on silicon dioxide. That method, however, requires careful control over temperature vs. time, which can be disadvantageous.

Accordingly, it would be desirable to have a method for SEG of semiconductive silicon or other semiconductor, which does not suffer from the disadvantage of prior art.

SUMMARY OF THE INVENTION

In order to mitigate the above-described disadvantage of the prior-art process of SEG of semiconductor, in accordance with the invention there is added to each window in the masking layer (located on the surface of the semiconductive substrate) an auxiliary (relatively small) aperture or "auxiliary window region" or lobe ("dog ear"). More specifically, each such window has a boundary that includes a pair of straight-line segments that would intersect each other at a point were it not for the presence of the auxiliary lobe. Accordingly, this point can and will be called a "virtual corner" of the window. Each such auxiliary aperture thus penetrates through the masking layer at each corner of the window, and the SEG of semiconductor is performed in each window as thus decorated with lobes. In this way, the area occupied by unwanted faceting is minimized ("the faceting is suppressed"). Although it should be understood that the theory is not essential to the invention, it is believed that the unwanted faceting is suppressed by virtue of a clash among the unwanted facets at the entrance to (or the "mouth" of) the lobe, whereby the undesired faceting cannot propagate out of the lobes into the remainder (main part) of the window (where transistor or other devices are to be built) but is captured within the lobes, these lobes occupying only a relatively small proportion of the total area of the window in which the SEG of semiconductor is grown. Typically the semiconductor is silicon.

In a specific embodiment, a semiconductive silicon body has a major surface which is oriented (100). A silicon dioxide layer is located on this major surface and has a rectangular window penetrating down to this major surface of the silicon body. The window has its sides oriented parallel to the <100> crystallographic direction of the silicon body. Each virtual corner of the window is decorated by an auxiliary lobe ("dog ear") having its three sides oriented parallel to the <110> crystallographic direction of the silicon body. Silicon is selectively epitaxially grown in this window, whereby the area occupied by unwanted facets at the corners is minimized ("suppressed"). Integrated circuit transistors can then be formed at the top surface of the then selectively epitaxially grown silicon. In other embodiments, different orientations of the auxiliary lobes can be used.

In all embodiments, the additional surface area that is required for the lobes is smaller than the planar area gained by the presence of the lobes (which confine the unwanted facets), whereby the lobes enable a net gain in transistor packing density.

BRIEF DESCRIPTION OF THE DRAWING(S)

This invention together with its features, advantages, and characteristics may be better understood from the following detailed description when read in conjunction with the drawings in which FIG. 1 is a top view diagram of a portion of an MOS transistor fabricated in a decorated window in SEG silicon, in accordance with a specific embodiment of the invention; and FIG. 2 is a top view diagram of a portion of an MOS transistor fabricated in a decorated window in SEG silicon, in accordance with another specific embodiment of the invention;

DETAILED DESCRIPTION

Figure 1:
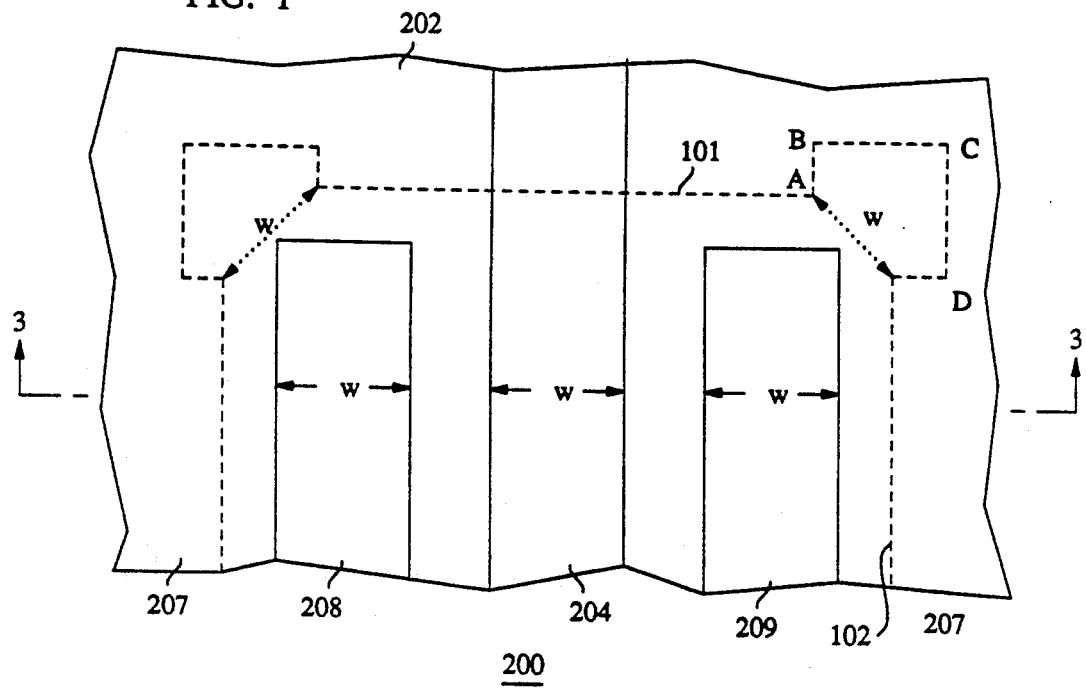
Figure 3:
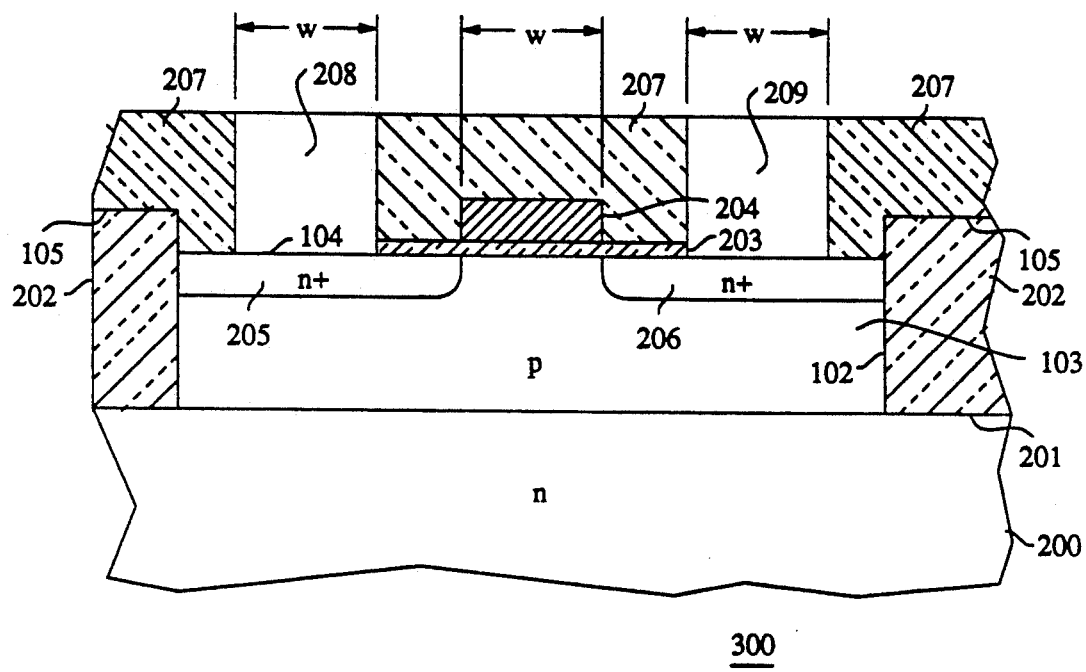
FIG. 3 is a side elevational view of a cross section of the MOS transistor shown in FIG. 1 or FIG. 2.

Turning to the drawings, FIG. 1 shows a top view of a portion of an MOS transistor 300 in an intermediate stage of its fabrication. A relatively thick (typically about 800 nm) masking layer of silicon dioxide (field oxide) 202 has a top surface 105. This field oxide layer 202 is located on a major surface 201 (FIG. 3) of a monocrystalline silicon substrate 200 oriented (100). A decorated rectangular window, with major side edges 101 and 102 bounding its undecorated portion and with side edges AB, BC, CD, and DE defining an exemplary auxiliary lobe, has been cut through the thick field oxide 202; and an SEG silicon region 103, having a top major surface 104, has been formed in this decorated window. The major side edge 101 of the window runs parallel to the <100> crystallographic direction of the silicon substrate 200. Source and drain diffusion regions 205 and 206, respectively, are located in the SEG silicon region 103 at its major surface 104. A portion of a gate electrode 204 is located on the top surface of a gate oxide layer 203 and has a width equal to w, the minimum feature size of the lithography being used to fabricate the transistor 300; and this gate electrode 204 typically extends from regions overlying the relatively thin gate oxide layer 203 into regions overlying the relatively thick field oxide 202.

Upon the gate oxide layer 203 is located a P-glass insulating layer 207. Rectangular apertures 208 and 209 through the resulting double oxide layer, composed of this P-glass layer and the gate oxide layer, typically have widths equal to w and enable the attachment of electrode contacts (not shown) to the source and drain regions 205 and 206, respectively, as known in the art. Advantageously, the top surface 104 of the SEG region 103 is located at a level that is below the top surface 105 of the field oxide 202, in order to suppress sidewall inversion of, and hence to suppress parasitic transistors formed by, the SEG silicon underlying the gate electrode at places where the latter steps from regions overlying the gate oxide 203 to regions overlying the field oxide 202.

Figure 2:
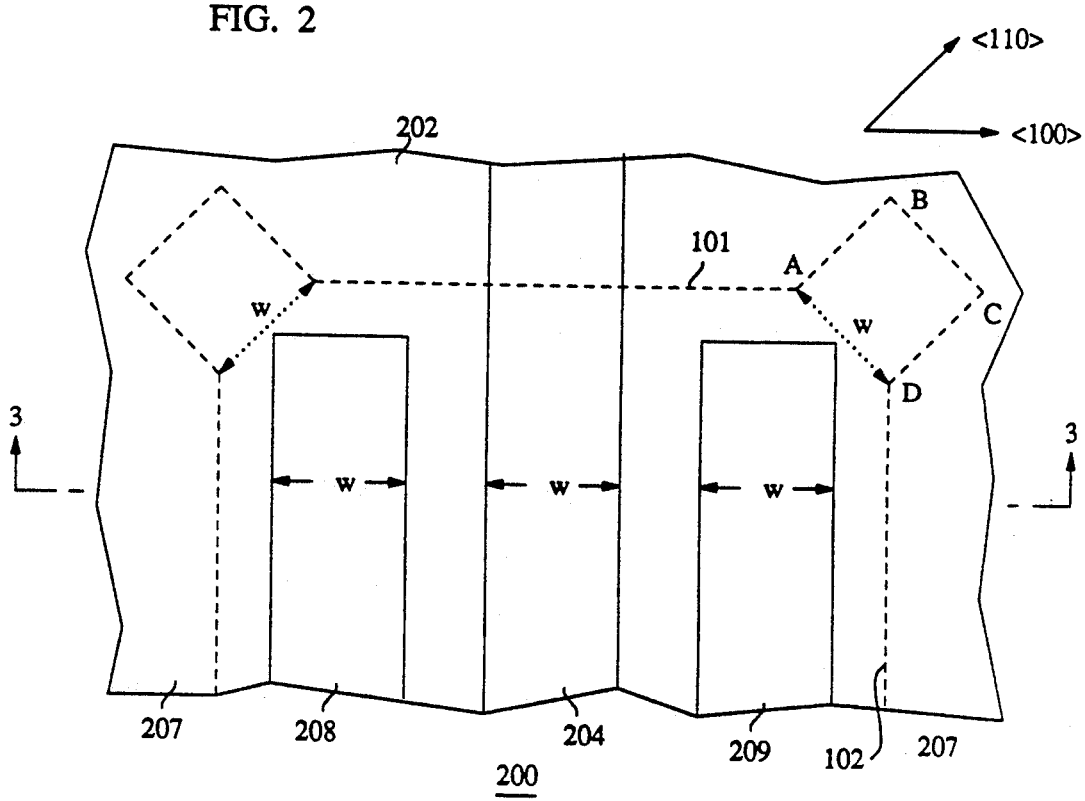

Turning now to FIG. 2, elements in FIG. 2 that are similar to those used in FIG. 1 are given the same reference numerals. Here in FIG. 2, again the side edge 101 is parallel to the <100> direction in the silicon substrate. However, each of the auxiliary lobes has three side edges for example, AB, BC, and CD, instead of four as in FIG. 1. The auxiliary side edges AB and CD (in FIG. 2) are parallel to the <110> crystallographic direction in the silicon substrate. Advantageously, to minimize the additional area consumed by the auxiliary lobes, AB=BC=CD=DA=w. A simple calculation shows that the additional area required for the auxiliary lobes shown in FIG. 2 is less than that required for the auxiliary lobes shown in FIG. 1.

It should be recognized that all fabrication steps for making the transistor are known in the art, except perhaps for the growth parameters to be used in the SEG step to form the region 103. For example, to form the SEG region 103 in windows (FIG. 2) the field oxide 202, first the silicon substrate was subjected to a five-minute pre-baking at about 1045 degrees C. in a radiantly heated barrel chamber at a reduced pressure of about 53 mbar. Then the temperature was lowered to about 950 degrees C. for the deposition cycle, with a deposition rate of approximately 0.07 $\mu$m per minute in the barrel chamber. The SEG process (of undoped silicon) was then achieved with a chemistry of $SiH_2Cl_2$, HCl, and $H_2$ at the reduced pressure of about 53 mbar and a mole ratio of HCl to $SiH_2Cl_2$ of 1.0 to 0.6. Doped SEG can be obtained by adding dopants to the ambient.

The pre-baking at 1045 degrees C. reduces the native $SiO_2$ film on the silicon surface as well as any other oxide films formed during the chemical cleaning of the surface prior to the SEG process. Lowering the temperature at which SEG is performed to 950 degrees C. is a compromise between good quality SEG and reasonably high growth rates. Use of the somewhat high HCl to $SiH_2Cl_2$ ratio (of 1.0 to 0.6) enhances the selectivity of growth favoring exposed silicon surfaces as opposed to exposed $SiO_2$ surfaces.

Figure 4:
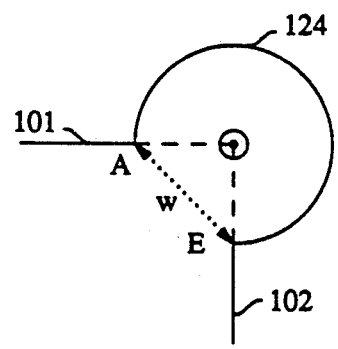
FIG. 4 is a top view diagram of a decorated portion of a decorated window in accordance with another specific embodiment of the invention.

Instead of the auxiliary lobes having straight boundary edges as shown in FIGS. 1 and 2, they can advantageously have curvilinear boundary edges 124 (FIG. 4) or 125 (FIG. 5), in order to minimize further the required added surface area. In FIG. 4, the edges 101 and 102 of the original rectangular window intersect at point O, which is the center of a circular arc 124. This arc 124 subtends an angle of $3\pi/2$ radian; and the distance AE=w, just as in FIG. 1. The radius of this circular arc 124 is equal to $OE=AE/\sqrt{2}=w/\sqrt{2}$.

Figure 5:
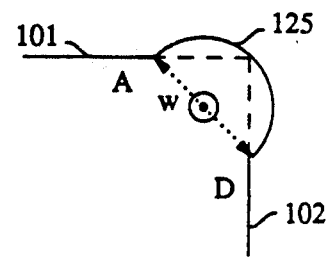
FIG. 5 is a top view diagram of a decorated portion of a decorated window in accordance with yet another specific embodiment of the invention.

In FIG. 5, the edges 101 and 102 intersect at a point X which lies on a circular arc 125 centered at point O. In turn, point O lies along AD=w, the radius OA=OD=OX of this arc being equal to w/2.

Note that in FIGS. 1 and 4 the distances across the mouths AE of the lobes are both equal to w; and in FIGS. 2 and 5 the distances across the mouths AD of the lobes are also both equal to w. Also note that, as indicated in FIGS. 1, 2, 4, and 5, the major side edges 101 and 102 form straight-line segments that would intersect each other at a point located either somewhere within (FIGS. 1, 2 and 4) or at the boundary of (FIG. 5) the respective auxiliary lobe were it not for the presence of the auxiliary lobe itself. Therefore, the major side edges 101 and 102 can be said to "virtually intersect" each other at the virtual corner of the window.

Although the invention has been described in terms of specific embodiments, various modifications can be made without departing from the scope of the invention. For example, other orientations of the surface of the silicon and other semiconductors can be used, as well as other shapes of the lobes.

I claim:

1. A selectively epitaxially grown semiconductor region, the region being located in a window and in an auxiliary window region both etched in a masking layer, the window having a virtual corner defined by a virtual intersection of a first and a second major edge of the window, the semiconductor region and the masking layer being located on a major surface of a monocrystalline semiconductor body, the auxiliary window region being located adjacent to and outside the window, the window and the auxiliary window region penetrating through the masking layer to the major surface of the semiconductor body, whereby the semiconductor region is decorated by the auxiliary window region.

2. The semiconductive region of claim 1 in which the auxiliary window region has at least a first auxiliary side edge running parallel to a crystallographic direction of the monocrystalline semiconductor body and has two other auxiliary side edges running perpendicular to the first auxiliary side edge.

3. The monocrystalline semiconductor region of claim 2 in which the semiconductor body is silicon and in which the major surface is oriented (100).

4. The semiconductor region of claim 2 or 3 in which the auxiliary window region has a total of only three auxiliary side edges.

5. The semiconductor region of claim 4 in which the crystallographic direction is the <110> crystallographic direction of the monocrystalline semiconductor body.

6. The semiconductor region of claim 2 or 3 in which the auxiliary window region has two auxiliary side edges running parallel to the crystallographic direction in addition to two other auxiliary side edges running perpendicular to the first auxiliary side edge, for a total of four auxiliary side edges.

7. The semiconductor region of claim 6 in which the crystallographic direction is the <100> crystallographic direction of the monocrystalline semiconductor body.

8. In an integrated circuit comprising a transistor having a minimum feature size, the transistor being located within the semiconductor region in accordance with claim 1, the distance across the mouth of the auxiliary window region is at least approximately equal to the minimum feature size.

9. In an integrated circuit according to claim 8, the transistor being an MOS transistor having a gate electrode, the gate electrode having a width equal to a minimum feature size.

10. In an integrated circuit comprising a transistor having a minimum feature size, the transistor being located within the semiconductor region in accordance with claim 4, the distance across the mouth of the auxiliary window region is at least approximately equal to the minimum feature size.

11. In an integrated circuit according to claim 10, the transistor being an MOS transistor having a gate electrode, the gate electrode having a width equal to a minimum feature size.

* * * * *